United States Patent [19]

Reilly et al.

[11] Patent Number: 4,583,099

[45] Date of Patent: Apr. 15, 1986

[54] RESONANT TAG CIRCUITS USEFUL IN ELECTRONIC SECURITY SYSTEMS

[75] Inventors: Phillip B. Reilly, Mountain Lakes, N.J.; Jan Vandebult, Topsfield, Mass.

[73] Assignee: Polyonics Corporation, Newburyport, Mass.

[21] Appl. No.: 565,350

[22] Filed: Dec. 27, 1983

[51] Int. Cl.[4] .............................................. H01Q 1/36
[52] U.S. Cl. ................................................... 343/895
[58] Field of Search .................. 340/572; 343/895, 908

[56] References Cited

U.S. PATENT DOCUMENTS

| 3,017,633 | 1/1962 | Marston et al. | 343/895 |
| 4,021,705 | 5/1977 | Lichtblau | 340/572 |

Primary Examiner—Eli Lieberman
Attorney, Agent, or Firm—Paul J. Cook

[57] ABSTRACT

A resonant tag circuit is provided which is useful in conjunction with an electronic security system for preventing theft of articles from a protected area. The tag circuit comprises an electrically insulating substrate having a spiral conductive path on each surface of the substrate. The spiral conductive paths are positioned to overlap each other to effect distributed capacitance. The degree of overlap of the distributed capacitance portion of the conductive paths is such that it provides at least 70%, preferably 90% and most preferably 100% of the total overlapping portions of the circuit.

14 Claims, 17 Drawing Figures

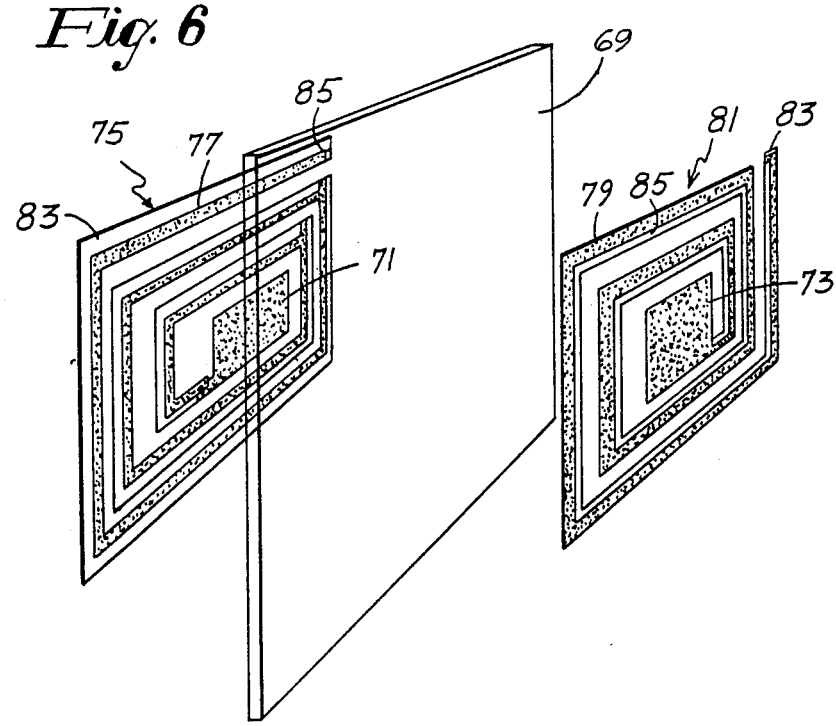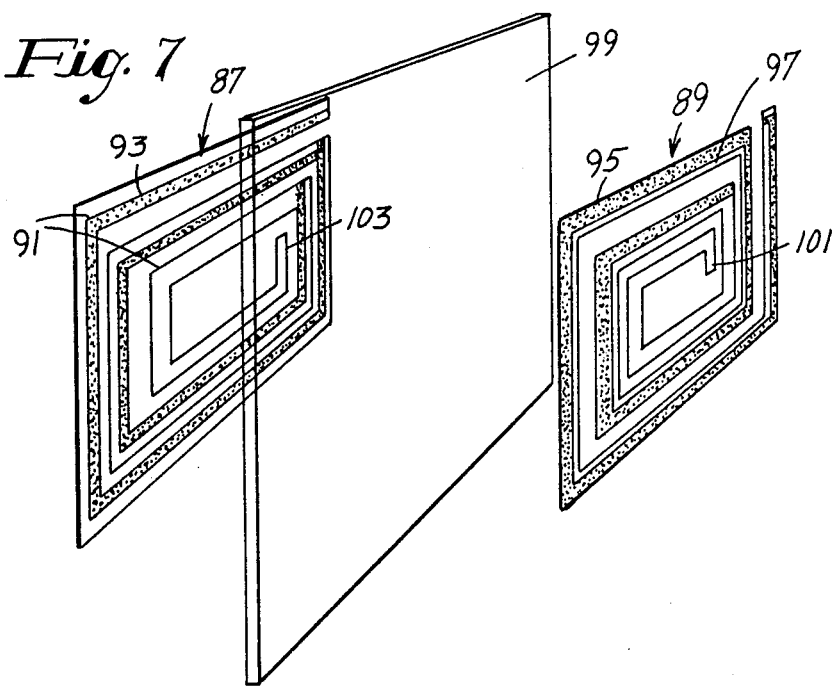

RESONANT TAG CIRCUITS USEFUL IN ELECTRONIC SECURITY SYSTEMS

BACKGROUND OF THE INVENTION

This invention relates to a resonant tag circuit design useful in conjunction with an electronic security system for reliably detecting a circuit within a controlled area.

Inventory shrinkage as a result of shoplifting costs U.S. retailers in excess of $10 billion per year. To counteract shoplifting, electronic security systems have been utilized to detect the unauthorized removal of articles from a protected area. These systems utilize radiowaves, microwaves or a magnetic field generated within a confined area through which all articles from the store must pass. A special electronic tag is attached to the article which is sensed by a receiving system to signify the unauthorized removal of the article. If the sensing system does not sense the presence of this special electronic tag within the confined area, then the removal of the article is authorized by virtue of its being paid for and the tag has been either removed from the article at the checkout counter or has been deactivated at the check-out counter. Presently there are two basic types of tags commercially available. One type is a large reusable tag mounted in a plastic housing which is usually fastened to clothing articles; while the other tag is relatively small and disposable and is normally pasted on packages. The large reusable plastic tags are expensive, but can be reused. The small disposable sticker tags can be made at low cost.

A preferred special electronic tag for both the reusable and the disposable applications, utilizes a technology based on tuned circuits that operate in the radio frequency range. To render the tuned circuit functional at the desired frequency, a discrete inductor (L) and discrete capacitor (C) are connected together. The reusable resonant tags use discrete capacitor and inductor components which are connected to form the tuned inductor-capacitor (LC) circuit. In the disposable resonant sticker tag, a discrete inductor and capacitor are formed on a dielectric substrate. Here, the capacitor and inductor are formed by conventional fabrication methods for forming printed circuits including selected use of laminated substrates having an interior dielectric layer laminated on both surfaces with a conductive composition such as aluminum or copper. The conductive layers are printed with an etchant resistant material in the form of the desired circuit and after etching, the remaining conductive material is now in the form of the desired circuit. Such a conventional process is disclosed, for example, in U.S. Pat. No. 3,913,219. Alternatively, the resonant tag circuits can be formed by an additive process whereby an activatable composition is printed upon a dielectric substrate in the form of the desired circuit. The activatable composition then is chemically activated so that, when placed in an electroless bath, it causes reduction of a conductive metal thereon selectively so that metal is not deposited on those areas which are not chemically activated. The electrolesscoated pattern then can be further coated with metal by conventional plating techniques to form a resonant tag circuit. Alternately, the resonant tag circuits can be formed by an additive process whereby the film is chemically treated to render it platable and a plating mask is used to prevent plating in noncircuit areas. Alternatively, the resonant tag circuits can be formed by stamping, dye cutting, precision fine blanking or other form of stamping the circuit out of thin metal sheets and laminating the two sides to the circuit on opposite sides of a film.

Prior to the present invention, the resonant tag circuits were formed with discrete inductor and capacitor components. Such tags are shown, for example, in U.S. Pat. Nos. 3,967,161; 4,021,705; 3,913,219; 4,369,557; 3,810,147 and 3,863,244. These prior art tags, by virtue of their use of an inductor and a capacitor as separate elements introduce inherent limitations in the disposable resonant sticker tag produced therewith.

In these resonant tag circuits, it is desirable to produce tags that operate at specific frequencies. Specific frequencies can be obtained by varying L and/or C based on the equation:

$$f = \frac{1}{2\pi \sqrt{LC}} \qquad \text{EQUATION 1}$$

In general, it is also desirable to have a sharp resonance curve where there is a large change in impedance as a function of frequency over a narrow frequency range in order to provide the desired selectivity to discriminate between tuned circuits and environmental interferences.

The sharpness of the resonance curve is usually determined by a quality factor called "Q" which can be defined as the ratio of the reactance of either the coil or the capacitor at resonant frequency to the total resistance. It is also a measure of the reactive power stored in the tuned circuit to the actual power dissipated in the resistance. The higher the "Q", the greater the amount of energy stored in the circuit compared with the energy lost in the resistance during each cycle.

Therefore, it is generally desirable to have a resonant tag circuit with a high "Q" factor.

Mathematically:

$$Q = \frac{X_L}{R} = \frac{2\pi f L}{R}, \qquad \text{EQUATION 2}$$

or $$Q = \frac{X_C}{R} = \frac{1}{2\pi f C R} \qquad \text{EQUATION 3}$$

Where
$X_L$ = Inductive reactance
$X_C$ = Capacitive reactance
L = Inductance
C = Capacitance
f = Frequency
R = Resistance.

Combining equations 2 and 3:

$$Q = \frac{1}{R} \sqrt{\frac{L}{C}} \qquad \text{EQUATION 4}$$

which indicates "Q" can be improved by:
(a) Lowering the resistance (R)
(b) Increasing the inductance (L)
(c) Reducing the capacitance (C).

The "Q" factor is also related to the power stored in the resonant tag circuit which means, the dielectric loss of the substrate should be minimized to improve the "Q" factor. This dielectric loss is normally referred to as the dielectric dissipation factor of the capacitor.

Assuming the dielectric dissipation factor for a particular class of resonant tag circuits is constant, then lowering the series resistance, increasing the inductance and/or lowering the capacitance, are three possible variables that can be changed to improving the "Q" factor for a resonant tag circuit tuned at a specific frequency.

The most obvious approach for improving "Q" is to reduce the resistance (R). Difficulty in improving "Q" is increased when "Q" is to be improved by adjusting the L/C ratio because when L is increased, C must be reduced to maintain the desired frequency; and in most cases, the resistance (R) increases as L is increased because an increase in inductance is usually associated with a longer inductor.

In many applications, it is desirable to have a resonant tag that is relatively small, inexpensive to made and functions as an antenna allowing it to be sensed by detecting equipment. Adding these three additional objectives to making a high "Q" factor resonant tag circuit that functions at a specific frequency further complicates the circuit design when using a discrete inductor in combination with a discrete capacitor.

Presently available resonant sticker tag circuits are produced by an etching process. U.S. Pat. No. 3,863,244, issued Jan. 28, 1975, and U.S. Pat. No. 3,967,161, issued June 29, 1976, disclose resonant tag circuits which are fabricated by etched circuit techniques. The tag circuit comprises an insulatve substrate having one portion of the circuit formed on one side of the substrate and another portion of the circuit formed on the opposite side of the substrate. Electrical connection is made between the portions of the circuit on opposite sides of the substrate by means of a conductive pin or eyelet extending through the substrate, or by means of a spot weld joining confronting circuit areas. U.S. Pat. No. 4,021,705, issued May 3, 1977, discloses a similar type of resonant tag circuit.

U.S. Pat. No. 3,913,219, issued Oct. 21, 1975, discloses a fabrication process for planar resonant tag circuits. in which both sides of a web of insulative material are provided with a conductive material to serve as conductive surfaces from which circuit patterns are formed by etched circuit techniques. Electrical connection is established between the two conductive patterns on opposing faces to the web by welding confronting conductive surfaces, such as by ultrasonic welding or cold-welding with the aid of a tool having a chisel-like tip.

These resonant tag circuits require a relatively long and thin inductor line with many turns and a large capacitor plate (FIGS. 1-4) to properly tune the resonant tag circuit, but this fine circuit line with many turns is difficult to produce by etching techniques without having shorts or delamination of the conductive material. This same fine circuit line and large capacitor plate is equally, if not more difficult, to make by an additive process where electroplating may be required to reduce the resistance. The fine circuit line cannot carry a substantial amount of current, thereby requiring an extremely long time to deposit conductive metal onto this fine line. When plating is finished, the portion of the line closest to the electroplating connection would be plated to a much greater thickness than other portions of the line with the excessive amounts of conductive material being an undesirable increase in the cost of the overall circuit. This same fine circuit line and capacitor plate would be equally difficult to produce by stamping and laminating techniques because the inductor coil is long and thin and a relatively large capacitor is located along or at the end of this thin coil making it difficult to handle after stamping and equally difficult to place on an insulative substrate and properly align prior to lamination.

Accordingly, it would be highly desirable to provide a resonant tag circuit which is resonant at a desired frequency, has a high "Q" factor, is relatively small in size, can be detected by existing detection equipment and can be made economically and quickly by etching, additive plating and stamping/laminating techniques.

SUMMARY OF THE INVENTION

It is an object of this invention to provide a resonant tag circuit design for use in electronic security systems, which can be manufactured in high volume at very low cost, by minimizing the area the conductive patterns utilize to make a resonant circuit with specific frequency response characteristics.

It is a further object of this invention to provide a resonant tag circuit design with conductive patterns on opposing sides of an insulative substrate which have substantially equal areas for optimum speed and ease of processing by various methods of manufacturing such as etching, plating or die cutting.

A further object of this invention is to provide a resonant tag circuit design with tapered conductive patterns on opposing sides of an insulative substrate forming the inductor coil, whereby the width of the pattern decreases towards the inner portion of the coil pattern in order to facilitate the electroplating of the patterns to a more uniform thickness, for example, by an additive process and to allow more space for additional coil winds to increase the inductance, thereby allowing the frequency to be lowered and improving the "Q" factor.

A further object of this invention is to provide a resonant tag circuit design with wide patterns and a minimum number of inductor coil windings on each side of an insulative substrate to facilitate ease of processing during manufacturing such as by etching, die cutting and plating techniques.

A further object of this invention is to provide a resonant tag circuit design wherein the conductive pattern forming one half of the inductor coil portion and capacitor portion of the resonant tag circuit on one side of an insulative substrate is slightly wider than the conductive pattern of the opposite side of the insulative substrate to minimize the effect of undesirable misalignment of the opposing patterns on each side of the insulative substrate.

In accordance with this invention, a resonant tag circuit is provided with inductor coil circuit paths on the two separate surfaces of a thin dielectric sheet such as a plastic sheet, whereby a portion or all of the inductor coil circuit paths cooperate with the inductor coil circuit paths on the opposing surface of the dielectric sheet to form the capacitor of the tuned circuit. The inductor coils and amount of capacitance achieved between the overlapping inductor coil circuit paths (distributed capacitance) is such as to tune the circuit at the desired frequency, yielding a high "Q" factor, and strong antenna effect. The inductor coils each are formed from a spiral conductive path that turns through at least 360 degrees. In a preferred aspect of this invention, it is desirable to control the distributed capacitance provided between the opposing inductor coil circuit paths such as to eliminate the need for any discrete capacitance means in the circuit. In any event, the discrete capacitance means provides less than about 30% of the total capacitance required by the circuit, and preferably the discrete capacitance means is eliminated. By utilizing the resonant tag circuit design of this invention, it is possible to provide smaller resonant tag circuits than can be obtained with present circuit designs, the need for the fine lines in the inductor circuits required by present resonant tag circuits is reduced or eliminated and permits the use of etching (subtractive) means, additive means, and stamping techniques for forming circuits without the requirement of close tolerances in these processes. The distributed capacitor portion of the tuned circuit can be formed between the inner portions of the inductor coil circuit paths, the outer portions of the inductor coil circuit paths or intermediate portions of the inductor coil circuit paths.

BRIEF DESCRIPTION OF THE DRAWINGS

FIG. 6 shows a tag circuit having both distributed capacitance and discrete capacitance in accordance with this invention.

FIG. 7 shows a tag circuit with two opposing spiral conductive paths wherein there is only partial overlap for distributed capacitance.

FIGS. 12a and 12b show a first preferred embodiment of this invention.

FIGS. 13a and 13b show a second preferred embodiment of this invention.

FIGS. 14a and 14b show a third preferred embodiment of this invention.

DETAILED DESCRIPTION OF SPECIFIC EMBODIMENTS

Figure 1:
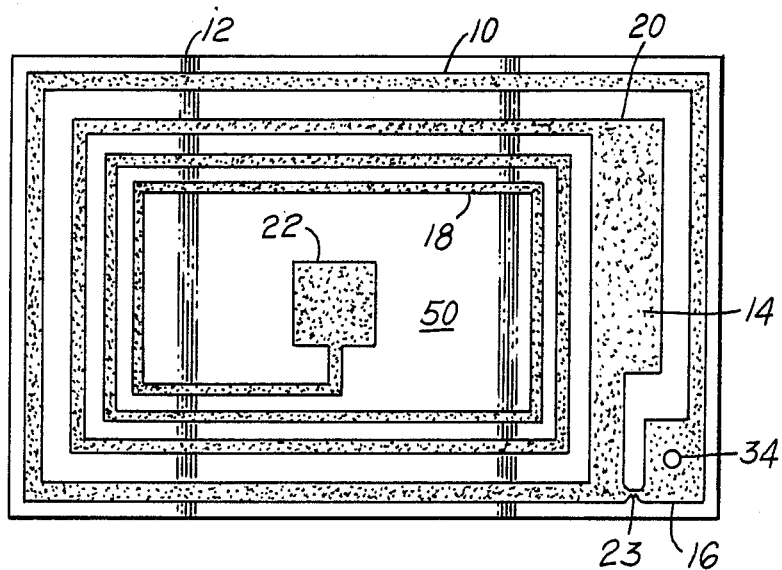
FIG. 1 shows one side of a typical prior art resonant circuit tag including the inductor coil.

As used herein, the term "spiral conductive path" or "spiral path" means a continuous conductive path that turns through greater than 360 degrees.

As used herein, the term "discrete capacitance" or "discrete capacitor" means a capacitor element formed from two conductive paths, each located on one surface of an electrically insulating substrate such as a plastic sheet and which conductive paths overlap each other a sufficiently great area as to function primarily as a capacitor which has little inductance. The relative contribution of capacitance or inductance can be estimated as a first approximation by measuring the overlap area for a specific element and the overlap area of the total circuit as compared to measuring the total length of a specific element in the direction of the spiral path(s) and the total length of the inductor coil(s) in the resonant tag circuit(s). When the ratio defined by Formula 1 is greater than 10, the circuit element is a discrete capacitor as that term is used herein:

$$\text{Ratio} = \frac{\frac{A}{A_T}}{\frac{L}{L_T}} \qquad \text{Formula 1}$$

wherein A equals the area of overlap for a conductive element that contributes to capacitance and inductance, $A_T$ equals the total capacitor area of the resonant tag circuit(s), L equals the total length of the conductive element in the direction of the spiral path(s) that contributes to capacitance and inductance and $L_T$ equals the total inductor length in the direction of the spiral of the resonant tag circuit(s). The factors of Formula 1 can be directly measured.

As used herein, the term "distributed capacitor" or "distributed capacitance" means a circuit element which functions both as a capacitor and as an inductor. The distributed capacitor is formed from two overlapping spiral conductive paths, one each on a surface of an electrically insulating layer. The relative contribution of capacitance to inductance is approximated by Formula 1. A distributed capacitor in accordance with this invention has a ratio according to Formula 1 of 10 or less. In accordance with this invention, the distributed capacitor portion of the circuit provides at least 70% of the area of overlap between the two opposing spiral conductive paths, preferably at least 90% of such overlap and most preferably at least 100% of such overlap.

In accordance with this invention, a resonant tag circuit is formed by inductor coil circuit paths affixed to the opposing surfaces of a dielectric substrate. Each inductor coil is formed of a spiral such as a rectangular spiral, circular spiral, triangular spiral or the like wherein a portion of the spiral overlaps with a corresponding portion of the spiral on the opposite surface wherein the degree of overlap is controlled to form a distributed capacitor comprising the overlapping portions of the spiral and the interposed dielectric material between the two overlapping portions of the spiral. The remaining portions of the spiral can be offset from each other so that their function as inductor coils does not contribute to capacitance. One end of the spiral inductor coil may be electrically connected to the corresponding end of the spiral inductor coil on the opposing surface of the dielectric material. Using the distributed capacitance, it is possible to eliminate the need for *any* through hole connection provided the amount of distributed capacitance and inductance is sufficient to tune the circuit to the desired frequency.

In one embodiment of this invention, a fusable link can be introduced into either one or both of the inductor coil circuit paths at any section of the spiral coil. This fusable link can be destroyed with electromagnetic energy at a specific frequency to deactivate the tag circuit. The distributed capacitor portion of each inductor coil can comprise the outer portion of the spiral path, the inner portion of the spiral path and/or an intermediate portion of the spiral path.

In another embodiment of this invention, the inductor coil circuit paths are tapered, the outside spiral path being the widest and tapering down towards the inner spiral path to optimize current carrying capacity during the electroplating of the circuit. In another embodiment of this invention, the inductor coil circuit paths are tapered to minimize the amount of conductive material located near the center of the tag to improve the antenna effect of the tuned circuit. In still another embodiment of this invention, the inductor coil paths are tapered to increase the number of possible coil winds that can be added, thus increasing the inductance, reducing the frequency and/or increasing the "Q" factor.

It is not necessary that the circuit paths on both surfaces of the insulating layer be identical. For example, the circuit path or coil on one surface of the insulating layer can be wider than the circuit path or coil on the opposite surface so that the desired overlap of circuit paths is achieved even though there is minor misalignment of the circuit paths during manufacture. This embodiment provides latitude during manufacture which minimizes the production of misfunctioning tag circuits.

Figure 2:
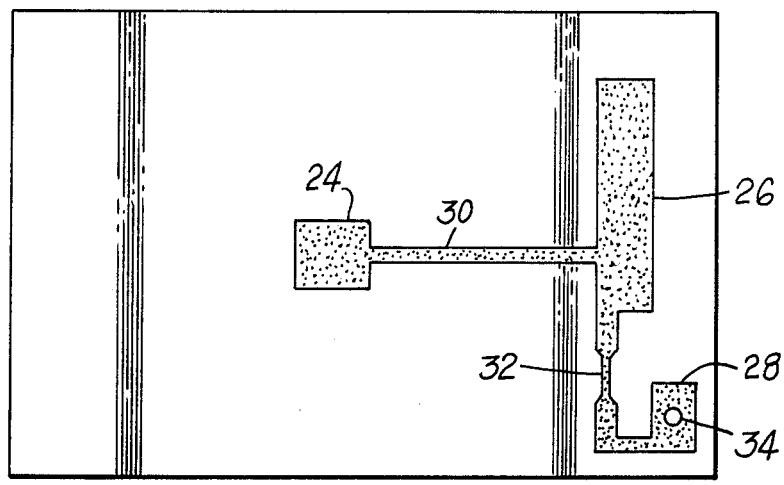
FIG. 2 is a second side of a typical prior art resonant tag circuit which cooperates with the circuit of FIG. 1.

Referring to FIGS. 1 and 2, a prior art multifrequency resonant circuit is shown which includes the requirement of a separate capacitor means comprising a conductive area 22 which cooperates with conductive area 24 with an interposed dielectric substrate to form the capacitor. The circuit is formed by conventional etching means and includes a first conductive path 10 arranged in a generally rectangular path on a surface of an insulative substrate 12 terminating at one end in a conductive area 14. The other end of path 10 terminates at conductive area 16. A second conductive path 18 is formed as a rectangular spiral on substrate 12 and terminates at junction 20 with area 14 and at its inner end at conductive path 22. A conductive path 23 connects area 14 and area 16 and is dimensioned to fuse upon flow therethrough of a predetermined current produced upon energization of the circuit by an applied energizing field. The opposite surface of substrate 12 shown in FIG. 2 includes a conductive area 24 aligned with conductive area 22 shown in FIG. 1 and a pair of conductive areas 26 and 28 in alignment with areas 14 and 16 on the opposing surface. The conductive areas 24 and 26 are interconnected with a conductive path 30 while the conductive areas 26 and 28 are interconnected by a conductive path 32. Conductive path 32 also is dimensioned to fuse upon energization by a predetermined electromagnetic field, thereby to alter the resonant properties of the tag circuit. Areas 16 and 28 are electrically connected by conductive pin 34 extending through the substrate 12.

The conductive areas 10 and 18 serve as inductors of the resonant circuit. The conductive areas 22 and 24 spaced by the interposed substrate 12 serve as a first capacitor while a second capacitor is formed by the conductive area 14 cooperating with path 26 on the opposing substrate surface. In order for the conductive paths 10 and 18 to function as inductors, they must be spaced apart a certain distance from conductive areas 22 and 24 which serve as the capacitive portion of the overall circuit. Thus, the overall minimum size of the circuit is much larger than a circuit wherein the separate capacitor means corresponding to the conductive areas 22 and 24 is eliminated. The larger circuits are much more costly to produce since they require significantly more raw materials and chemicals and a longer manufacturing time. Accordingly, it would be highly desirable to provide an efficient tag circuit design wherein the interior capacitive portion corresponding to conductive areas 22 and 24 could be eliminated. Such a design would permit the use of a tighter spiral conductive path which would allow the size of the circuit to be reduced and be produced much faster than those produced at the present time such as those shown in FIGS. 1 and 2.

Figure 3:
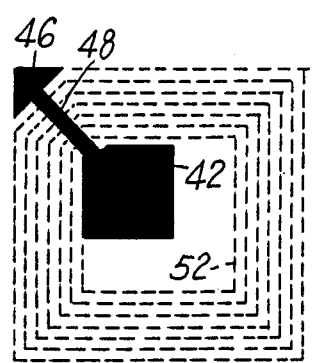
FIG. 3 is one side of a prior art resonant tag circuit which does not include the inductor.
Figure 4:
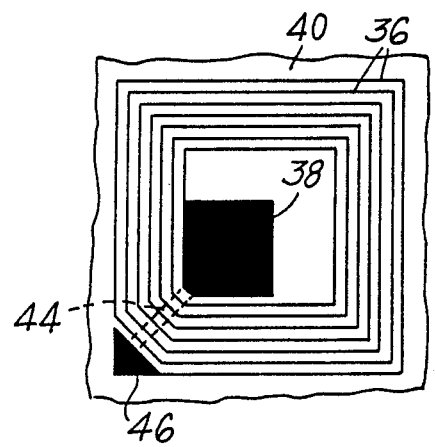
FIG. 4 is a prior art resonant tag circuit which cooperates with the circuit of FIG. 3 and which includes the inductor.

FIGS. 3 and 4 show an alternative prior art resonant circuit tag which is used widely. One side of the tag is shown in FIG. 3 and comprises a conductive area 42 which functions as part of a capacitor which overlaps with conductive area 38 (see FIG. 4) and wherein an insulating layer such as a plastic layer is interposed between the conductive areas 38 and 42. The conductive area 42 is connected to conductive area 46 which extends through the insulating layer and is connected to conductive path 44 which, in turn, is connected to conductive area 38. Coil 36 is positioned on the same surface of insulating layer 40 as is conductive area 38 wherein one end of the coil 36 is connected to conductive area 38 while the other end of coil 36 is connected to connector 46. The coil 36 functions as the inductor while the conductive areas 38 and 42 together with insulating layer 40 function as the capacitor.

Figure 5:
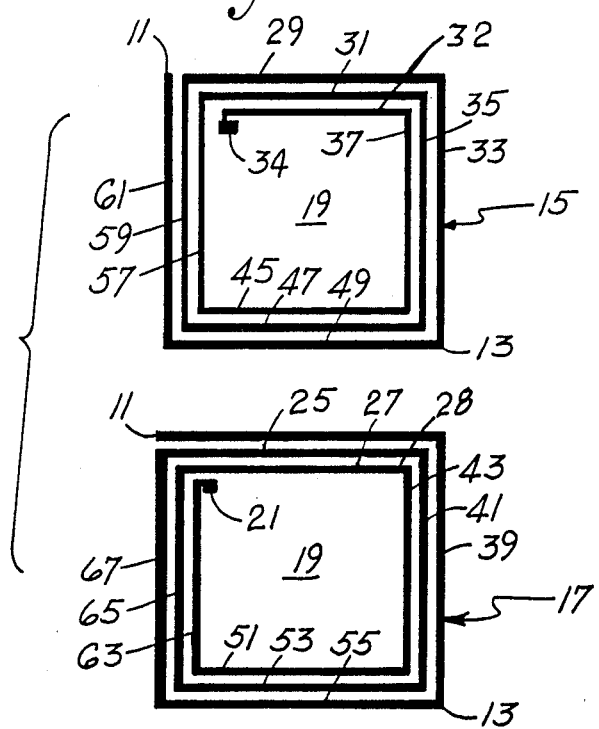
FIG. 5 shows two circuit paths on opposing surfaces of an insulating layer in accordance with this invention.

Referring to FIG. 5, a resonant circuit comprising the present invention which has a center frequency of 8.1 MHz is shown. This circuit is formed by overlapping points 11 to each other and points 13 to each on opposing surfaces of an insulating layer. Conductive path 15 is provided on one surface and conductive path 17 is provided on the opposing surface. A conductive path extends through the insulating layer 19 and is connected to points 21 and 23 on opposing surfaces of the insulating layer 19 so that the conductive paths 15 and 17 are connected thereby. The conductive paths 15 and 17 overlap each other on windings 25, 27 and 28 which overlap windings 29, 31 and 32. Windings 33, 35 and 37 overlap windings 39, 41 and 43, respectively. Conductive paths 45, 47 and 49 overlap conductive paths 51, 53 and 55, respectively, while conductive paths 57, 59 and 61 overlap conductive paths 63, 65 and 67, respectively. Utilizing this design, a discrete capacitor can be eliminated and the conductive paths 15 and 17 cooperate together to provide both the inductor function and the distributed capacitor function. On one side of the tag, the inductor line is only about 18 inches and the line width varies from between about 0.08 inches and 0.06 inches. The total surface area utilized on one side of the tag is less than about 55%. Thus, by utilizing the design of the present invention, the discrete capacitor can be eliminated and the size of the overall tag can be made much smaller than that which can be made by the prior art designs.

Utilizing the distributed capacitance design shown in FIG. 5 to manufacture a tag resonant circuit provides many significant advantages. Utilizing the present state of the art etching processes, the manufacturing time and cost is greatly reduced as compared to prior art tag resonant circuit designs having a discrete capacitor because the circuit line in the design of this invention can be made wider, thereby allowing thinner conductive paths to be utilized. By utilizing wider lines which are thinner, the cost is reduced and the possibility of breaks or short circuits also is reduced. Furthermore, if an additive manufacturing approach were utilized which involves forming a pattern of the desired circuit on an insulated substrate, which pattern is rendered chemically active so that it can be plated with an electrically conductive material, the use of the distributed capacitance concept of this invention also allows the use of wider lines and a short line width per side of insulating material. In addition, a balanced two sided design can be utilized in the present invention. For example, with the prior art tag circuit shown in FIGS. 3 and 4, approximately 2 hours is required to form a plated copper conductive path to reduce the coil resistance to less than about 0.5 ohms. In contrast, in utilizing the pattern of the present invention shown in FIG. 5, the plating time can be reduced to less than about 20 minutes. In addition, if the manufacturing process used to form the desired circuit involves stamping, the use of distributed capacitance, as provided by the present invention, allows for the incorporation of a wide and short conductive path that has strength and form after stamping and that can be easily laminated with good registration from side to side. Accordingly, the present invention provides the natural advantages over the prior art tag circuit designs presently utilized.

Referring to FIG. 6, a resonant tag circuit is shown which includes both distributed capacitance and discrete capacitance wherein the discrete capacitance comprises less than about 30% of the total capacitance of the entire circuit. This contrasts with prior art tag circuit designs wherein the capacitance is prior-provided essentially entirely by discrete capacitance. As shown in FIG. 6, the discrete capacitor is formed from conductive area 71 and conductive area 73 located on opposing surfaces of insulating layer 69. Conductive path 75 is formed from a rectangular spiral as shown in FIG. 6 wherein a portion of the conductive path shown in darkened area 77 overlaps with the darkened portion 79 of conductive path 81. The overlapping portions of couductive paths 75 and 81 function as a distributed capacitor as well as the inductor. Conductive paths 75 and 81 can be joined through or around the substrate 69 by means of electrical connections 83 and 85.

Referring to FIG. 7, a resonant circuit is shown wherein there is partial overlap of two separate conductive paths 87 and 89. The light portion 91 of spiral 87 does not overlap with spiral 89 while the dark portion 93 of spiral 87 overlaps with the dark portion 95 of spiral 89. Similarly, the light portion 97 of spiral 89 does not overlap with spiral 87. Spirals 87 and 89 can be connected through insulated substrate 99 at points 101 and 103.

Figure 8:
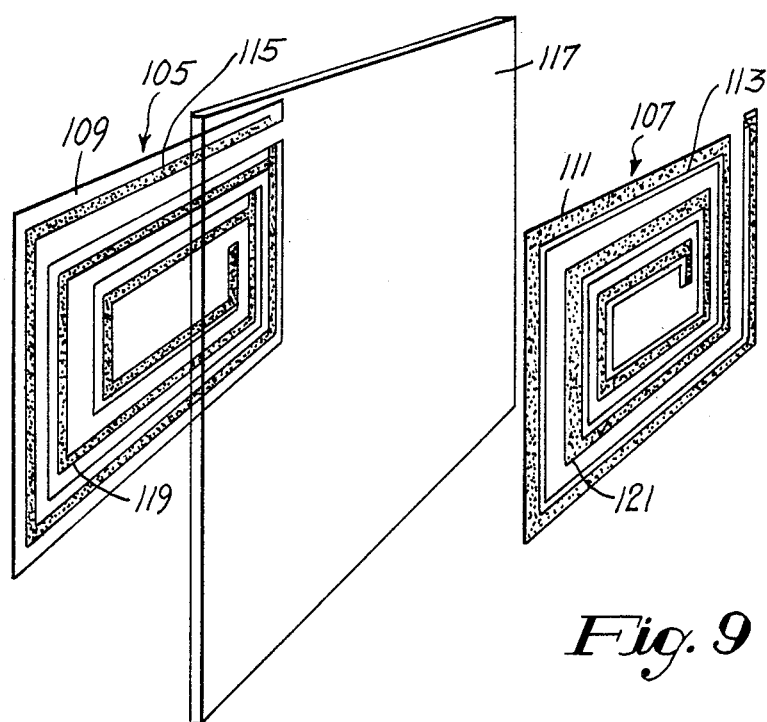
FIG. 8 shows a tag circuit with two opposing spiral conductive paths wherein there is full overlap for distributed capacitance.

Referring to FIG. 8, an alternative embodiment is shown wherein there is partial overlap between two conductive paths 105 and 107 over the entire length of each circuit. As is the case in FIGS. 6 and 7, the light portions 109 and 111 of the respective spirals do not overlap each other while the dark portions 113 and 115 of each spiral overlap each other. Electrical connections between the two spirals can be made through substrate 117 at points 119 and 121.

Figure 9:
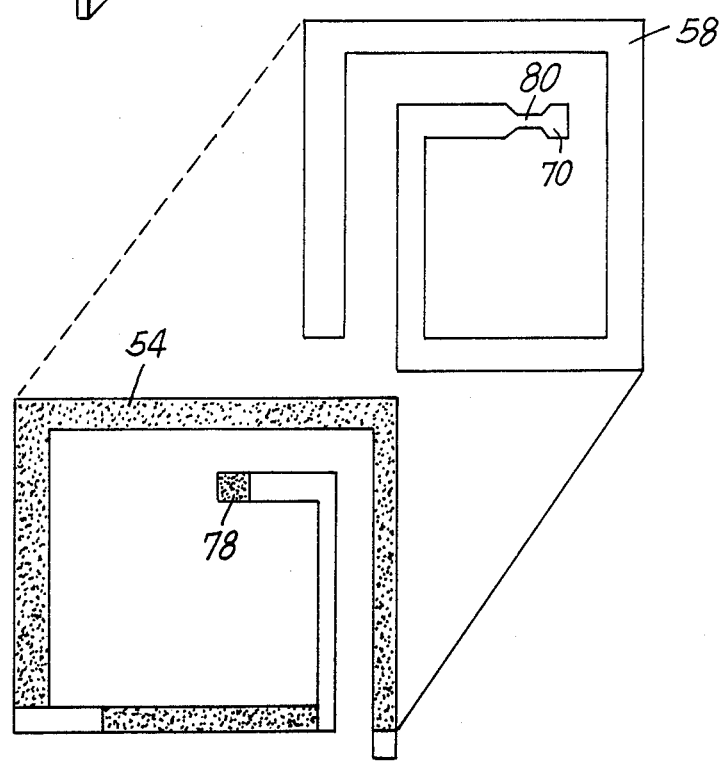
FIG. 9 is an exploded view of a resonant tag circuit of this invention which includes a fusable link.

Referring to FIG. 9, conductive paths 54 and 58 are shown which are provided with fusable link 80. The conductive paths 54 and 58 are connected through an insulated substrate (not shown) at points 70 and 78. The fusable link 80 can be rendered inoperative by means of radio frequency energy in a manner well known in the art.

As noted above, the essential feature of this invention comprises distributed capacitance wherein at least a portion of the rectangular spiral conductive paths overlap each other to effect distributed capacitance so as to form a resonant circuit that resonates at the desired frequency while utilizing a minimum circuit area. The incorporation of distributed capacitance design allows the circuit to be made more economically using conventional printing and etching processes and allows the use of other unique cost-effective technologies such as plating and stamping which cannot be utilized economically with a design incorporating discrete capacitor and inductor elements. By comparing the resonant circuits shown in FIGS. 3 and 4 with the resonant circuit of FIG. 5, both tuned to the same frequency of about 8.1 MHz, the inductive path 36 of FIG. 4 consists of 7 lines with an overall length of 43 inches utilizing 70% of the area on one side of the tag for only the inductor. When the capacitor area is added to that of the inductor, over 80% of the area is utilized. The tag shown in FIGS. 3 and 4 has many problems limiting it to manufacture by etching techniques. These limiting factors include the fact that the inductor line is too narrow and the length is too long, causing shorting problems and excessive plating time. If an additive approach incorporating electroplating were to be used, this requires over two hours to plate up this design with sufficient copper to reduce the total coil resistance to less than about 0.5 ohm. When this is done, the copper thickness on the outer portion of the coil 36 can exceed 2 mils while the inner-most portion of the coil will have only about 0.5 miles of copper. Furthermore, the narrow line and long line length make stamped parts difficult to make and extremely difficult to handle and register. The 43 inch coil loses all integrity as soon as it has been stamped and the location of the discrete capacitor plate 38 at the end of the 43 inch coil is extremely difficult to register over the conductive surface 42 located on the opposite side of the dielectric substrate. Furthermore, the narrow lines can also cause major manufacturing problems when using conventional etching techniques. The etching solution can undercut the conductive metal that is laminated to the dielectric substrate, thereby causing breaks in the circuit line or short circuiting. In addition, a significant amount of surface area is taken up with the discrete capacitor and conductor and this reduces flexibility in making circuits that are smaller or can be tuned at lower frequencies.

Figure 10:
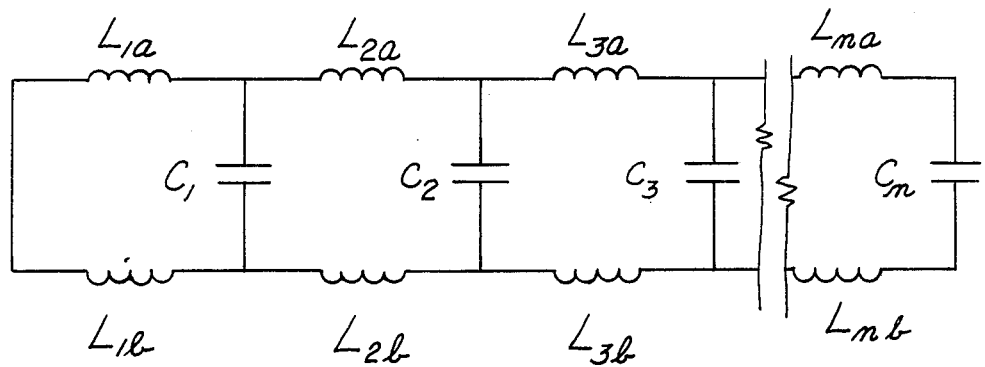
FIG. 10 shows an equivalence circuit for the tuned resonant circuits produced in accordance with this invention.

Referring to FIG. 10, the equivalent circuit of this invention is made up of a plurality of inductor portions $L_{la}-L_{na}$ and $L_{lb}-L_{nb}$ as well as distributed capacitor portions $C_l-C_n$.

Figure 11:
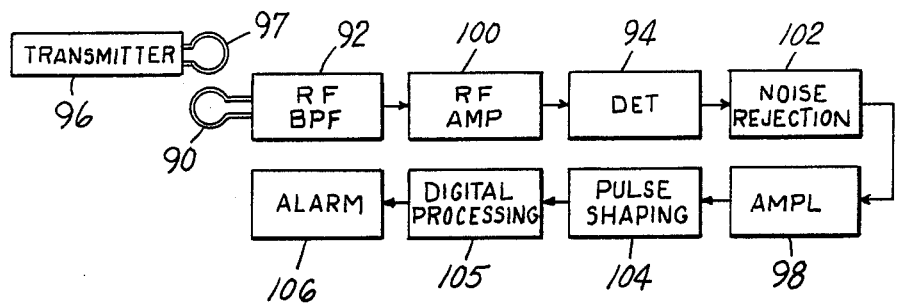
FIG. 11 is a diagram showing a representative system utilizing the resonant tag of this invention.

Referring to FIG. 11, the electronic security system utilized in the present invention includes a transmitter 96 coupled to an antenna 97, typically a loop antenna operative to provide an electromagnetic field within a predetermined area to be controlled. A receiving antenna 90, also typically a loop antenna, is arranged at the controlled area to receive energy radiating by transmitter antenna 97 and to couple received energy to an Rf front end which includes an Rf band pass filter 92 and Rf amplifier 100. The output of amplifier 100 is applied to a detector 94, the output of which is, in turn, coupled to noise rejection circuitry 102. Output signals from noise rejection circuitry 102 are amplified by amplifier 98 and applied to pulse shaping circuitry 104 and thence to digital processing circuitry 88, the output of which is operative to actuate an alarm 106 or other output utilization apparatus.

EXAMPLE I

FIGS. 12a and 12b represent a resonant tag circuit design that utilizes distributed capacitance along the entire length of the inductor circuit paths. This design has two conductive paths (110 to 111 and 112 to 113) located on opposite sides of a dielectric substrate (not shown) both of which have tapered line widths starting with a wider line at the outermost wind and progressively becoming thinner towards the center. This resonant tag circuit is formed by registering the following points: 114 to 115, 116 to 117, 118 to 119 and 120 to 121. In this example, the conductive material is copper and the insulating material is polypropylene and the resonant tag circuit was made by an additive electroplating process. The polypropylene first is treated to render it receptive to electroless and electrolytic plating. The film is passed through a solvent to swell the film. Thereafter, it is passed through a chromic acid etching bath and thence through a palladium-tin activater solution. The dielectric is masked in the non-circuit area and thereafter plated with copper electrolessly and electrolytically.

When the two conductive paths are connected with a through substrate connection at 111 to 113 (the innermost point), then the frequency is 6.4 MHz. When the two conductive paths are connected at 110 to 113 (the outermost point), then the frequency is 8.7 MHz. When the two conductive paths are connected along the conductive paths at points 134 and 135, the frequency is 8.2 MHz.

EXAMPLE II

FIGS. 13a and 13b represent a resonant tag circuit design that utilizes distributed capacitance along a portion of the inductor circuit path. This design has two conductive paths (130 to 135 and 132 to 134) located on opposite sides of a dielectric substrate (not shown). The resonant tag circuit is formed by registering the following points —122 to 123, 124 to 125, 126 to 127 and 128 to 129. The conductive paths have tapered line widths starting with a wider line at the outermost wind and progressively becoming thinner towards the center. Distributed capacitance is developed by inductor overlap of the outside wind 130 to 131 overlapping 132 to 133. In this example, the conductive material is aluminum, the insulating material is polyethylene and the tag is made by a masking and etching process. An aluminum foil laminate comprising polyethylene, laminated on each surface with about 2 mils aluminum was masked in the circuit area and then etched in an alkaline-caustic bath to form the circuit. Using a 1.00 mil polyethylene dielectric and connecting the two conductive patterns at point 134 and 135, this tag circuit has a resonant frequency of 8.8 MHz.

EXAMPLE III

FIGS. 14a and 14b represent a resonant tag circuit design that utilizes distributed capacitance along a portion of the inductor circuit path. This design has two conductive paths (145 to 149 and 147 to 150) located on opposite sides of a dielectric substrate (not shown). The resonant tag circuit is formed by registering the following points —137 to 138, 139 to 140, 141 to 142 and 143 to 144. The conductive paths have tapered line widths starting with a wider line at the outermost wind and progressively becoming thinner towards the center. Distributed capacitance is developed by inductor overlap of the two outermost winds 145 to 146 overlapping 147 to 148. In this example, the conductive material is copper, the insulating material is polypropylene and the tag was made by the additive plating of Example I. Using a 1.25 mil polypropylene dielectric and connecting the two conductive patterns at point 149 and 150, this tag circuit has a resonant frequency of 8.2 MHz.

We claim:

1. A resonant tag circuit which comprises:
   an electrically insulating substrate,
   a first spiral conductive path on a first surface of said substrate,
   a second spiral conductive path on a second surface of said substrate,
   said first spiral conductive path and second spiral conductive path, forming inductors and being aligned so that they overlap each other over at least a portion of the length of said conductive paths thereby to form a distributed capacitor by virtue of said alignment,
   the degree of said overlap contributing to distributed capacitance being at least 70% of the overlap between conductive elements on opposing surfaces of said insulating substrate.

2. The resonant tag circuit of claim 1 wherein the degree of overlap contributing to distributed capacitance is at least 90% of the overlap between conductive elements on opposing surfaces of said insulating substrate.

3. The resonant tag circuit of claim 1 wherein the degree of overlap contributing to distributed capacitance is 100% of the overlap between conductive elements on opposing surfaces of said insulating substrate.

4. The circuit of any one of claims 1, 2 or 3 wherein said first spiral conductive path has an inner and an outer portion and wherein said outer portion comprises a conductive path which is wider than the inner portion of the conductive path.

5. The circuit of any one of claims 1, 2 or 3 wherein each of said first and second spiral conductive paths have an inner portion and an outer portion and wherein said outer portions are wider than said inner portions.

6. The circuit of any one of claims 1, 2 or 3 wherein at least one of said conductive paths includes a fusible link.

7. The circuit of any one of claims 1, 2 or 3 wherein a portion of said conductive paths overlap each other over substantially the entire length of at least one of said conductive paths.

8. The circuit of any one of claims 1, 2 or 3 wherein said conductive paths are electrically connected to each other.

9. The circuit of any one of claims 1, 2 or 3 wherein said conductive paths are electrically insulated from each other.

10. The circuit of any one of claims 1, 2 or 3 wherein said first and second spiral conductive paths have substantially equal areas.

11. The circuit of claim 8 wherein said first and second spiral conductive paths forming the inductor coil have the same spiral direction.

12. the circuit of any one of claims 1, 2 or 3 wherein said first spiral conductive path is wider than said second spiral conductive path.

13. The circuit of any one of claims 1, 2 or 3 wherein the diameter of said first spiral conductive path is larger than the diameter of said second spiral conductive path.

14. The circuit of any one of claims 1, 2 or 3 wherein said first spiral conductive path and said second spiral conductive path each form approximately one half of the inductor coil and one half of the capacitor element of said resonant tag circuit.

* * * * *

UNITED STATES PATENT AND TRADEMARK OFFICE
CERTIFICATE OF CORRECTION

PATENT NO. : 4,583,099                    Page 1 of 3
DATED      : April 15, 1986
INVENTOR(S) : Phillip B. Reilly and Jan Vandebult It is certified that error appears in the above-identified patent and that said Letters Patent is hereby corrected as shown below: Figures 12a through 14b should be as follows.

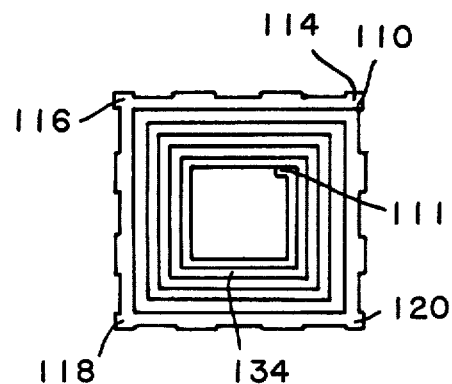

FIG. 12a

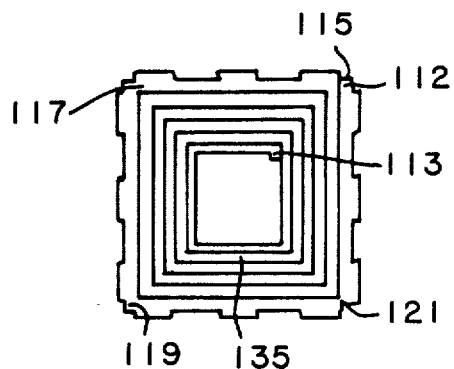

FIG. 12b

UNITED STATES PATENT AND TRADEMARK OFFICE
CERTIFICATE OF CORRECTION

PATENT NO. : 4,583,099   Page 2 of 3
DATED : April 15, 1986
INVENTOR(S) : Phillip B. Reilly and Jan Vandebult It is certified that error appears in the above-identified patent and that said Letters Patent is hereby corrected as shown below:

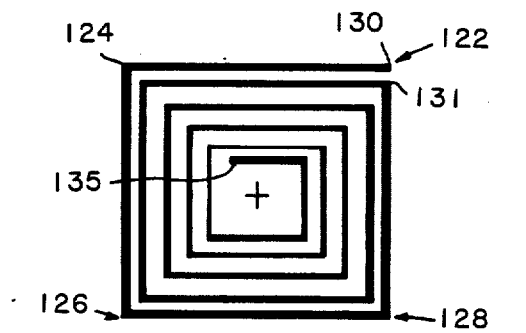

FIG. 13a

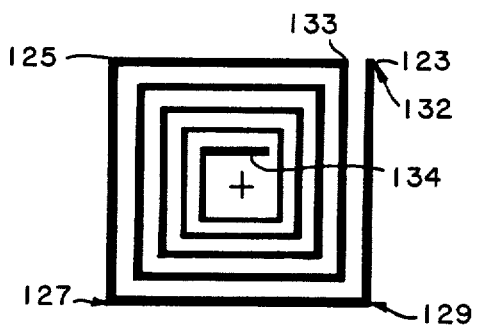

FIG. 13b

UNITED STATES PATENT AND TRADEMARK OFFICE
CERTIFICATE OF CORRECTION

PATENT NO. : 4,583,099  Page 3 of 3
DATED : April 15, 1986
INVENTOR(S) : Phillip B. Reilly and Jan Vandebult It is certified that error appears in the above-identified patent and that said Letters Patent is hereby corrected as shown below:

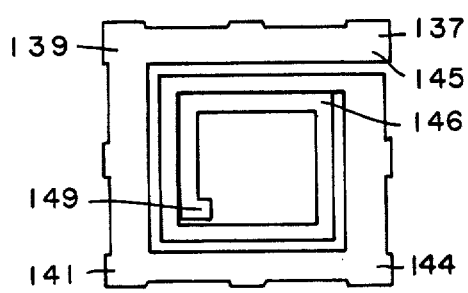

FIG. 14a

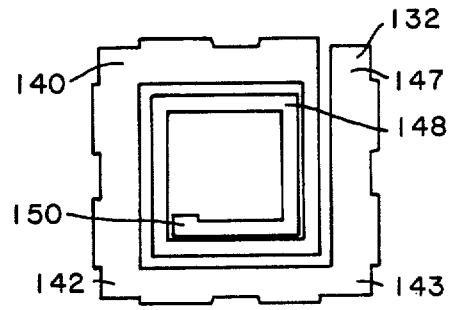

FIG. 14b

Signed and Sealed this

Sixteenth Day of December, 1986

Attest:

DONALD J. QUIGG

*Attesting Officer*  *Commissioner of Patents and Trademarks*